United States Patent [19]

Daniele et al.

[11] 4,315,239
[45] Feb. 9, 1982

[54] PROCESS FOR PRODUCING A CALIBRATED RESISTANCE ELEMENT AND INTEGRATED CIRCUITRY INCORPORATING SAME

[75] Inventors: Vincenzo Daniele, Milano; Giuseppe Corda, Saronno; Andrea Ravaglia, Bologna; Giuseppe Ferla, Milano, all of Italy

[73] Assignee: SGS Ates, Componenti Elettronici S.P.A., Milano, Italy

[21] Appl. No.: 177,595

[22] Filed: Aug. 13, 1980

Related U.S. Application Data

[62] Division of Ser. No. 34,204, Apr. 27, 1979.

[30] Foreign Application Priority Data

Apr. 28, 1978 [IT] Italy ............... 22788A/78

[51] Int. Cl.³ .................................. H01C 1/02
[52] U.S. Cl. ........................... 338/308; 29/580; 29/610 R; 338/314; 357/51
[58] Field of Search .................. 338/308, 309, 314; 357/51, 80; 156/653, 657; 29/610, 620, 580, 578; 427/96, 102, 103

[56] References Cited

U.S. PATENT DOCUMENTS

| 4,001,762 | 1/1977 | Aoki et al. ............... 338/314 X |
| 4,057,894 | 11/1977 | Khajezadeh et al. ........ 357/51 X |
| 4,214,917 | 7/1980 | Clark et al. ............. 357/51 X |
| 4,228,451 | 10/1980 | Priel et al. ............. 357/51 |

Primary Examiner—C. L. Albritton
Attorney, Agent, or Firm—Karl F. Ross

[57] ABSTRACT

Filiform elements of predetermined resistivity, e.g. selectively destructible leads of an electrically programmable read-only memory, are formed on a semiconductor substrate such as a silicon body by first depositing thereon a layer of dielectric material such as $SiO_2$ and topping that layer with a conductive or nonconductive coating which is resistant to a chemical such as hydrofluoric acid capable of attacking the dielectric layer. Next, the top coating is partly destroyed by photolithographic treatment to leave at least one substantially rectangular patch. Thereafter, the dielectric layer is isotropically attacked by the aforementioned chemical with resulting reduction to about half its original thickness and concurrent lateral erosion of a patch-supporting pedestal of that layer whereby channels of generally semicylindrical concavity are formed around the periphery of this pedestal. The patch, if composed of conductive or semiconductive material, is then clad in an insulating envelope whereupon the dielectric layer and the patch are covered with a deposit of the desired electrical conductivity which could consist of doped polycrystalline silicon or of metal. Finally, this deposit is removed by chemical or ionic etching except in the channels of the pedestal and along a pair of parallel strips adjoining opposite pedestal sides whereby these strips remain electrically interconnected by filiform inserts left in the undercuts of the other two sides.

6 Claims, 12 Drawing Figures

PROCESS FOR PRODUCING A CALIBRATED RESISTANCE ELEMENT AND INTEGRATED CIRCUITRY INCORPORATING SAME

This is a division of application Ser. No. 034,204, filed Apr. 27, 1979, pending.

FIELD OF THE INVENTION

Our present invention relates to integrated circuitry including a calibrated resistance element on a substrate.

BACKGROUND OF THE INVENTION

Resistance elements of the type contemplated by us may be used as fusible leads forming part of an electrically programmable read-only memory (EPROM), designed to be selectively destroyed by a burn-through procedure in which they are traversed by an elevated electric current. Such a memory, as is well known in the art, may comprise a two-dimensional matrix of cells each consisting, in the simplest case, of a single active semiconductor component connected to a respective reading wire via fusible lead of the type referred to. In integrated circuitry, such a lead usually consists of a resistance element of metal or doped semiconductor material, e.g. polycrystalline silicon, designed to carry small operating currents well below the fusion level used for programming.

Conventionally, such resistance elements are manufactured by thin-film technique as conductor strips on an insulating substrate. Their resistance is determined by taking into account the various electrical and structural parameters such as the maximum voltage which can be tolerated by the memory cells during programming, the available surface area, and the resistivity of the conductor material.

In practice, these fusible leads are not exactly identical in view of unavoidable manufacturing tolerances. Thus, the destructive current employed in programming is to be chosen on the basis of the minimum resistance of all the fusible leads in the array. This minimum resistance, therefore, must not be so low as to require a burn-through current of a magnitude that may impair the active memory components.

One of the factors significantly influencing the resistance of these leads is their width. With thin-film conductor strips, that thickness cannot be made less than two to three microns with today's manufacturing procedures. By way of example it may be mentioned that, in order to rupture such a conventional fusible lead with a resistance of 1000 ohms, a current pulse of 30 mA and a duration of 0.3 $\mu$sec is needed.

OBJECTS OF THE INVENTION

The object of our present invention is therefore to provide an integrated-circuit element which, thanks to its extremely limited width, may be made relatively short so as to occupy only a small area on a substrate while still having the resistance required for electrical burn-through or other purposes.

SUMMARY OF THE INVENTION

In the production of integrated circuitry embodying our present invention, a dielectric layer attackable by a certain chemical agent is deposited on a substrate, preferably on a body of semiconductor material such as silicon, and is topped with a coating of different material which is resistant to attack by that agent. The coating is then destroyed in part so as to leave a residue with at least one exposed lateral edge, the residue being preferably in the form of a substantially rectangular patch with four exposed edges. Next, we subject the dielectric layer to an isotropic attack by the aforementioned chemical agent with resulting reduction in the thickness of that layer everywhere except underneath the residue or patch of the top coating where a pedestal supporting that patch is left in position, the height of this pedestal above the substrate corresponding to the original thickness of the dielectric layer. The isotropic attack also results in the erosion of the periphery of the pedestal underneath the exposed patch edge or edges with formation of a concave undercut extending over the entire length of each of these edges. Thereafter, a conductive deposit of predetermined resistivity is formed on the dielectric layer at least to the level of the patch but preferably also above the latter, a filiform portion of that deposit penetrating into each undercut of the pedestal. Finally, the conductive deposit is removed (e.g. by chemical or ionic etching) at least along the pedestal edge or edges while the filiform portion or portions accumulated in the undercut or undercuts are left intact to constitute the desired resistance element or elements. Advantageously, the height of each resistance element as determined by the reduction in the thickness of the dielectric layer is less than one micron.

The top coating constituting the patch may consist of nonconductive material, e.g. a silicon compound, in which case no further treatment of that patch is necessary before the conductive deposit is applied. If, however, the patch consists of conductive or semiconductive material, the latter may have to be clad with a protective envelope in order to insulate it from the resulting resistance elements.

Other parts of the conductive deposit left in place in the last step of our aforedescribed process may form terminals or conductor strips interconnected by the filiform resistance element or elements.

BRIEF DESCRIPTION OF THE DRAWING

The above and other features of our invention will now be described in detail with reference to the accompanying drawing in which.

SPECIFIC DESCRIPTION

Figure 1A:
FIGS. 1a-1e are fragmentary cross-sectional views of an integrated-circuit structure according to our present invention, showing successive steps in the production of filiform resistance elements thereof.

In FIG. 1a we have shown a silicon wafer 2 forming part of an integrated circuit not further illustrated. On one surface of wafer 2 there is deposited a dielectrical layer 4 having a thickness of about 1$\mu$, this layer consisting for example of silicon dioxide produced by oxidizing the substrate 2 at a high temperature (900° C.). Layer 4 is then topped by a coating 6 with a thickness of about 0.4$\mu$, consisting of a different dielectrical material such as silicon nitride $Si_3N_4$, for instance. This coating may be conventionally applied by chemical vapor deposition.

Figure 1B:
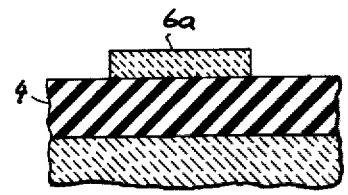

Next, part of coating 6 is destroyed by a photolithographic treatment with suitable masking so as to leave standing a residue in the form of a rectangular patch 6a shown in FIG. 1b. This is done with the aid of an etching agent, such as hot phosphoric acid, which does not attack the silicon dioxide of layer 4 to any significant degree.

Figure 1C:
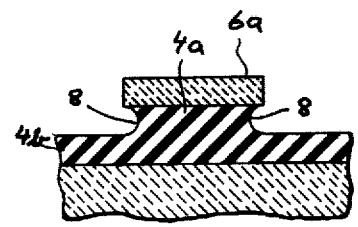

Thereafter, as shown in FIG. 1c, we use another chemical agent such as hydrofluoric acid for the purpose of removing part of dielectric layer 4 around patch 6a, the latter being resistant to this acid. This layer is reduced to substantially half its original thickness all around the patch 6a while a pedestal 4a is left in place to support that patch; because of the isotropic manner in which the acid attacks the layer 4, the exposed edges of that pedestal are concurrently eroded with formation of undercuts in the shape of generally semicylindrically concave channels 8 along these edges. With the dimensions assumed above, the pedestal 4a rises by about 0.5μ above the remaining layer 4b whose thickness is also about 0.5μ.

Figure 1D:
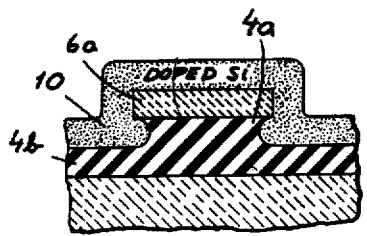

The resulting structure is then covered, as shown in FIG. 1d, by a conductive deposit 10 of predetermined resistivity whose thickness is at least equal to the height of the pedestal 4a, i.e. 0.5μ in this specific instance. If the patch 6a is not covered by a removable mask, the deposit 10 also overlies that patch as shown; continuous portions of this deposit accumulate within the lateral channels 8 of patch 4a. Deposit 10 may consist of polycrystalline silicon suitably doped to have a resistivity $\rho$ of $2 \cdot 10^{-3}$ ohm. cm, for example; a suitable way of producing this deposit is to crack monosilane SiH4 at high temperatures in the presence of impurities such as phosphorus or arsenic.

Figure 1E:
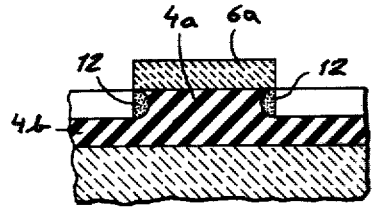
Figure 3:
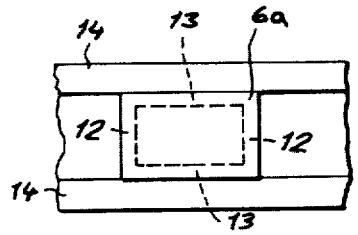
FIG. 3 is a fragmentary top view of the structure shown in FIG. 1e.

Finally, the deposit 10 is etched away by another photolithographic treatment around the pedestal 4a and the overlying patch 6a, the etching being discontinued at the instant when only a filiform remainder of this deposit is left in place in each channel 8 to constitute a resistance element 12 as shown in FIG. 1e. A suitable chemical etchant is a mixture of hydrofluoric and nitric acids. The resistance elements 12 embedded in channels 8 are of complementary semicylindrical shape and are flush with overlying edges of patch 6a. With suitable masking we also leave in place other parts of the conductive deposit 10 forming a pair of parallel conductor strips 14 as shown in FIG. 3. These conductor strips are extensions of portions 13 of deposit 10 left in peripheral channels of pedestal 4a transverse to the channels 8 seen in FIGS. 1c-1e. Thus, the two strips 14 are interconnected in parallel by two semicylindrical resistance elements 12 of the same height as the strips to which they are joined at opposite ends.

The two semicylindrical elements 12 are the equivalent of a cylindrical rod of the same diameter, i.e. 0.5μ. With their length L chosen to provide a resistance of 1000 ohms, according to the well-known formula $R = \rho \cdot L/s$ were s is the cross-sectional channel area here equal to about $0.2\mu^2$, we have found that a burn-through can be achieved with a minimum current pulse of 4 mA lasting for 0.3 μsec, thus of a magnitude of about 1/7 that required for the conventional thin-film strips.

Figure 2A:
FIGS. 2a-2f are views similar to FIGS. 1a-1e, illustrating a modified structure according to our invention.
Figure 2B:
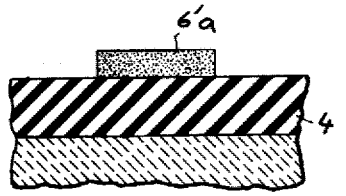
Figure 2C:
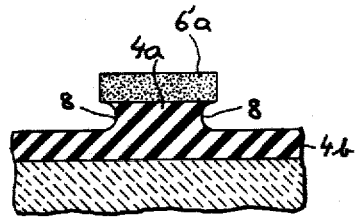
Figure 2D:
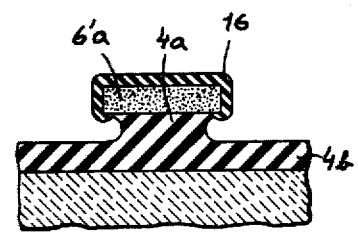
Figure 2E:
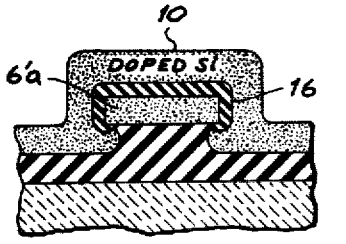
Figure 2F:
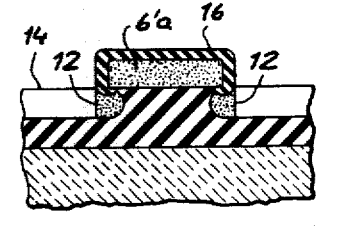

In FIGS. 2a-2f we have shown a process similar to that described with reference to FIGS. 1a-1e yet with the difference that the coating placed on top of the SiO2 layer 4 in the first step (FIG. 2a) consists of poly-crystalline silicon. FIGS. 2b and 2c show steps similar to those described with reference to FIGS. 1b and 1c, resulting in the formation of a rectangular patch 6'a supported by a pedestal 4a integral with the dielectric layer 4b of reduced thickness. Before the deposit 10 is applied to that layer, the patch 6'a is clad in a protective envelope 16 (FIG. 2d) of insulating material such as silicon dioxide which may be formed thereon in the manner described above for layer 4, i.e. by high-temperature oxidation of the coating residue 6'a. The presence of envelope 16 prevents the formation of any conductive bridge between the two resistance elements 12 subsequently occupying the channels 8. The remaining steps shown in FIGS. 2e and 2f are analogous to those discussed with reference to FIGS. 1d and 1e, respectively; the final structure corresponds again to that shown in FIG. 3.

The structures described may, of course, be modified in various ways, e.g. with only a single resistance element 12 interconnecting the two conductors 14 shown in FIG. 3. Part of the deposit 10 of polycrystalline silicon may be conventionally utilized to provide thin-film connections to other circuit components. Moreover, the residue 6'a of silicon coating 6' may be used as the control electrode or gate of a field-effect transistor of the insulated-gate type (IGFET).

The partial removal of deposit 10 in FIGS. 1e and 2f could be effected by ion bombarment rather than by chemical etching.

If the coating 6 or 6' is replaced by a metallic one, an insulating covering such as the envelope 16 of FIGS. 2d-2f will also be useful to prevent short-circuiting of the resistance elements 12 on opposite sides of pedestal 4a.

We claim:

1. Integrated circuitry comprising a substrate covered with a dielectric layer forming a pedestal of greater height, a coating of different material on said pedestal, at least one exposed edge of said pedestal having an undercut of generally semicylindrical shape extending over the entire length thereof, and a filiform resistance element of complementary shape embedded in said undercut while being substantially flush with an overlying edge of said coating.

2. Integrated circuitry as defined in claim 1, further comprising a pair of conductor strips on said layer conductively connected to said resistance element at opposite ends of said undercut.

3. Integrated circuitry as defined in claim 2 wherein said pedestal is substantially rectangular with symmetrical undercuts and embedded filiform resistance elements on opposite sides, said conductor strips extending transversely to said sides and being connected in parallel to both said resistance elements.

4. Integrated circuitry as defined in claim 2 or 3 wherein said conductor strips and said resistance element have a height of less than one micron.

5. Integrated circuitry as defined in claim 1, 2 or 3 wherein said dielectric layer has a thickness substantially equal to the height of said resistance element.

6. Integrated circuitry as defined in claim 5 wherein the height of said resistance element is substantially 0.5μ.

* * * * *